(12) United States Patent
Shen et al.

(10) Patent No.: US 6,328,634 B1
(45) Date of Patent: Dec. 11, 2001

(54) METHOD OF POLISHING

(75) Inventors: James Shen; Wesley D. Costas, both of Bear, DE (US)

(73) Assignee: Rodel Holdings Inc., Wilmington, DE (US)

( * ) Notice: Subject to any disclaimer, the term of this patent is extended or adjusted under 35 U.S.C. 154(b) by 0 days.

(21) Appl. No.: 09/567,905

(22) Filed: May 10, 2000

Related U.S. Application Data

(60) Provisional application No. 60/133,416, filed on May 11, 1999.

(51) Int. Cl.$^7$ ....................................................... B24B 1/00
(52) U.S. Cl. ................................ 451/41; 451/36; 451/56; 451/60; 451/287; 451/443
(58) Field of Search ................................. 451/36, 41, 56, 451/60, 287, 443

(56) References Cited

U.S. PATENT DOCUMENTS

| | | |
|---|---|---|
| 4,927,432 | 5/1990 | Budinger et al. . |
| 5,081,051 | 1/1992 | Mattingly et al. . |
| 5,489,233 | 2/1996 | Cook et al. . |
| 5,569,062 | 10/1996 | Karlsrud . |
| 6,022,268 * | 2/2000 | Roberts et al. ................ 451/548 |
| 6,095,902 * | 8/2000 | Reinhardt ........................ 451/36 |
| 6,106,754 * | 8/2000 | Cook et al. ..................... 264/113 |

* cited by examiner

Primary Examiner—Joseph J. Hail, III
Assistant Examiner—Shantese McDonald
(74) Attorney, Agent, or Firm—Kenneth A. Benson; Konrad Kaeding

(57) ABSTRACT

This invention describes methods of polishing with pads useful in the manufacture of semiconductor devices or the like. These pads have an advantageous hydrophilic polishing material and have an innovative surface topography and texture which generally improves predictability and polishing performance. These pads provide exceptional performance when used for polishing in conjunction with a slurry in which the abrasive particles are stabilized by use of an amino alcohol. They are also useful when used with slurries comprising an organic polymer.

12 Claims, 1 Drawing Sheet

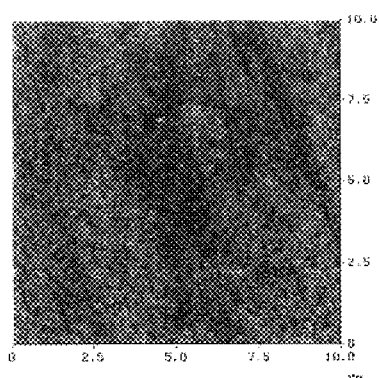
FIGURE 1. G
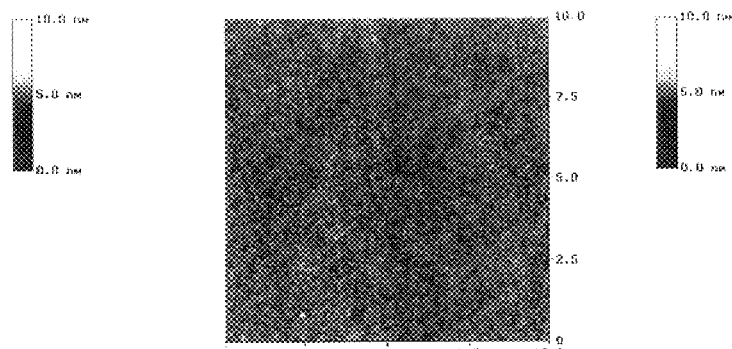
FIGURE 2. H
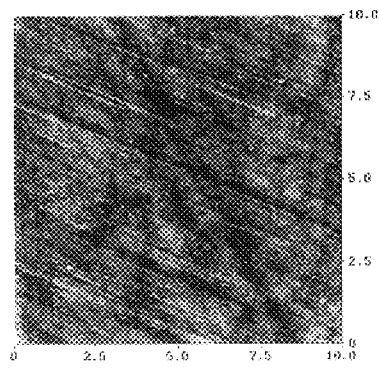
FIGURE 3. L
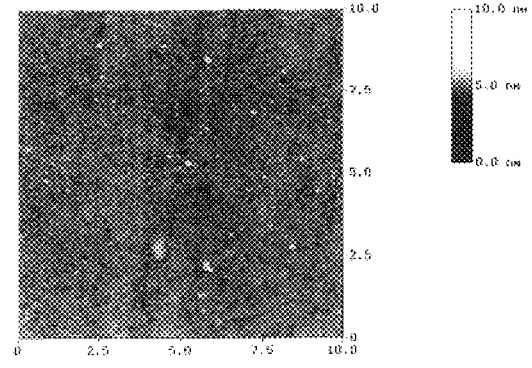
FIGURE 4. M

METHOD OF POLISHING

This application claims the benefit of Provisional Application Serial No. 60/133,416 filed May 11, 1999.

BACKGROUND OF THE INVENTION

1. Field of the Invention

The present invention relates generally to the method of use of polishing pads with polishing compositions in the manufacture of semiconductor devices or the like. More particularly, the polishing pads of the present invention comprise an advantageous hydrophilic material having an innovative surface topography and texture which generally improves polishing performance (as well as the predictability of polishing performance).

2. Discussion of the Related Art

Integrated circuit fabrication generally requires polishing of one or more substrates, such as silicon, silicon dioxide, tungsten, copper or aluminum. Such polishing is generally accomplished, using a polishing pad in combination with a polishing fluid.

The semiconductor industry has a need for precision polishing to narrow tolerances, but unwanted "pad to pad" variations in polishing performance are quite common. A need therefore exists in the semiconductor industry for polishing pads which exhibit more predicable performance during high precision polishing operations.

U.S. Pat. No. 5,569,062 describes a cutting means for abrading the surface of a polishing pad. U.S. Pat. No. 5,081,051 describes an elongated blade having a serrated edge pressing against a pad surface, thereby cutting circumferential grooves into the pad surface. U.S. 5,489,233 is directed to a polishing pad having large and small flow channels produced solely by external means upon the surface of a solid uniform polymer sheet.

During the chemical-mechanical polishing (CMP) of interlayer dielectrics used in the manufacture of integrated circuits a slurry is used in conjunction with a polishing pad to facilitate the removal of an insulator or dielectric material. In most CMP applications this insulating or dielectric material is $SiO_2$. In an aqueous environment the surface undergoes a hydration reaction with $H_2O$ to produce a surface network of hydroxylated Si molecules. Dissolution of this network generally occurs above a pH of 9.0 because of the solubility of the reaction product at high pH. Also, a high pH is desirable to achieve a high removal rate. Silicon Nitride, while chemically dissimilar to $SiO_2$, has shown generally similar polishing behavior. Thus, formulations shown to be suitable for the polishing of $SiO_2$ are also effective for silicon nitride, albeit at lower rates. To achieve this high pH, bases such as KOH and $NH_4OH$ are used to yield a pH of 10–11 in commercial production of polishing slurries useful for CMP of insulating layers.

It is imperative in the slurries useful for CMP removal of insulating materials that the dispersions of silicon dioxide particles upon which these slurries are based be stable. It is an object of this invention to provide dispersions of submicron abrasive particles which do not gel or settle out and, if there is sedimentation, that the sediment be easily redispersed. A further object of this invention is to provide slurries useful for the chemical-mechanical polishing of insulation layers on semiconductor wafers which are stable and provide a high quality surface for the semiconductor wafers upon polishing with the polishing pads of this invention.

SUMMARY OF THE INVENTION

The present invention is directed to methods of use of polishing pads having an innovative hydrophilic polishing layer and also an innovative polishing surface topography and texture. "Topography" is intended to mean surface characteristics on a scale of less than 10 microns, and "surface texture" is intended to mean surface characteristics of 10 microns or more.

The polishing pads of the present invention comprise a random surface topography. The random surface topography is preferably achieved by solidifying or otherwise forming (without cutting) the polishing surface, rather than cutting or skiving the pad from a larger material. Cutting or skiving causes a blade or other cutting implement to cut substantially parallel to the polishing surface being formed; such cutting tends to create a non-random surface topography, because as the blade cuts the polishing surface, it scores the surface or otherwise causes pattern on the surface; this pattern generally indicates the direction of cutting.

It has been surprisingly discovered that for certain high precision polishing applications, a non-random surface pattern, due to cutting or skiving, tend to create a relatively high (and unpredictable) number of undesirable macro-defects. "Macro-defects" are intended to mean burrs or other protrusions from the polishing surface of the pad which have a dimension (either width, height or length) of greater than 25 microns. Such macro-defects are detrimental to polishing and can cause performance variations between pads, because although the cutting process may be substantially the same for each pad, as the cutting instrument dulls, the amount of macro-defects created by the cutting instrument generally increases. Other factors which can cause variability in macro-defects during cutting include ambient temperature, and line speed variations.

Macro-defects should not be confused with "micro-asperities." Micro-asperities are intended to mean burrs or other protrusions from the polishing surface of the pad which have a dimension (either width, height or length) of less than 10 microns. It has been surprisingly discovered that micro-asperities are generally advantageous in precision polishing, particularly in the manufacture of semi-conductor devices.

The polishing materials of the present invention have no intrinsic ability to absorb or transport slurry particles, and therefore the present invention does not include felt-based polishing pads created by coalescing a polymer onto a fiber substrate, as described in U.S. Pat. No. 4,927,432 to Budinger, et al. Furthermore, the polishing materials of the present invention comprise a hydrophilic material having: i. a density greater than 0.5 g/cm$^3$; ii. a critical surface tension greater than or equal to 34 milliNewtons per meter; iii. a tensile modulus of 0.02 to 5 GigaPascals; iv. a ratio of tensile modulus at 30° C. to tensile modulus at 60° C. of 1.0 to 2.5; v. a hardness of 25 to 80 Shore D; vi. a yield stress of 300–6000 psi (2.1–41.4 MegaPascal); vii. a tensile strength of 1000 to 15,000 psi (7–105 MegaPascal); and viii. an elongation to break up to 500%. In a preferred embodiment, the polishing layer further comprises a plurality of soft domains and hard domains. The pads of this invention are particularly effective when they have a hardness of 50 to 80 Shore D and are used in conduction with the slurries of this invention.

The polishing layers of the present invention are manufactured by: 1. molding, embossing, printing, casting, sintering, photo-imaging, chemical etching, solidifying or otherwise creating pads without cutting the pad from a larger material; and 2. applying at least a portion of a macro-texture onto (or into) the polishing surface without cutting (or similar-type fracturing of) the polishing surface. The method(s) of the present invention are directed to causing a flowable material to form (without cutting) a macro-textured into or onto a surface (and optionally also forming a micro-texture) or alternatively (or in addition) thereafter inducing a macro-texture upon the polishing surface without cutting or similar type fracturing of the polishing surface, such as, by embossing. Optionally, additional macro-texture (and/or micro-texture) can thereafter be machined or otherwise cut into the polishing surface.

Another aspect of the present invention is a method for polishing a semiconductor wafer wherein the surface of said wafer is exposed to a polishing pad of this invention and to a to a polishing composition comprising: water, an aqueous dispersion of submicron abrasive particles for which an amino alcohol is used as a stabilizing component, and a chemically interactive component that interacts with the surface being polished.

Another aspect of the present invention is a method for polishing a semiconductor wafer wherein the surface of said wafer is exposed to a polishing pad of this invention and to a to a polishing composition comprising an organic polymer having a degree of polymerization of at least five, said polymer having a plurality of moieties with affinity to surface groups on said semiconductor wafer surface.

BRIEF DESCRIPTION OF THE DRAWINGS

FIG. 1 is an Atomic Force Microscope (AFM) image of a wafer surface after polishing with Slurry G.

FIG. 2 is an AFM image of a wafer surface after polishing with Slurry H.

FIG. 3 is an AFM image of a wafer surface after polishing with Slurry L.

FIG. 4 is an AFM image of a wafer surface after polishing with Slurry M.

DETAILED DESCRIPTION OF THE PREFERRED EMBODIMENTS

The present invention is directed to an improved method of polishing using a pad useful in the polishing or planarizing of substrates, particularly substrates for the manufacture of semiconductor devices or the like. The compositions and methods of the present invention may also be useful in other industries and can be applied to any one of a number of materials, including but not limited to silicon, silicon dioxide, metal, dielectrics (including polymeric dielectrics), ceramics and glass.

Macro defects (large surface defects of 25 microns or more due to fractures, abrasions and/or similar-type surface irregularities, generally arising from the cutting of a macro-texture into a pad) must be distinguished from micro asperities (small surface protrusions of 10 microns or less due to surface fractures, abrasion and/or similar-type surface irregularities, generally arising from the cutting of a micro-texture into a pad). Macro-texture and micro-texture provide very different functions for a polishing pad. The macro-texture provides a passageway (or a series of passageways) for distributing polishing fluid along the pad surface. The micro-texture can be very similar to the macro-texture, but on a much smaller scale.

Unlike the (much larger) macro-texture, the micro-texture is on a scale similar to that of the surface protrusions being polished away. The micro-texture provides an environment which enhances interaction between: 1. the polishing fluid and/or polishing particles; and 2. the protrusions to be polished away.

The present invention is innovative in its recognition that: 1. micro-asperities are generally beneficial to the polishing performance of a pad; and 2. macro-defects are generally detrimental to polishing performance of a pad. The present invention is also innovative in addressing the adverse affects of macro-defects by solidifying or otherwise forming or molding at least a portion of the macro-texture into or onto the polishing surface, macro-defects are dramatically reduced and pad performance is improved, relative to conventional pads produced by cutting a macro-texture into a pad.

In conventional pad manufacturing processes, mechanical cutting operations are used:

1. to cut pads from a polymer cake; or
2. to cut or otherwise machine a macro-texture into a pad.

The number of macro-defects can be dependent upon the sharpness of the cutting tool, line speed, ambient temperature/humidity and the like. This will tend to cause pad-to-pad variation in macro-defects which in turn will cause pad-to-pad variation in polishing performance.

The pads of the present invention comprise a polishing layer having an outer surface. Preferred processes in accordance with the present invention include: 1. thermoplastic injection molding, 2. thermoset injection molding (often referred to as "reaction injection molding" or "RIM"), 3. thermoplastic or thermoset injection blow molding, 4. compression molding, or 5. any similar-type process in which a flowable material is positioned and solidified, thereby creating at least a portion of a pad's macro-texture. In a preferred molding embodiment of the present invention: 1. the flowable material is forced into or onto a structure or substrate; 2. the structure or substrate imparts a surface texture into the material as it solidifies; and 3. the structure or substrate is thereafter separated from the solidified material.

In one embodiment of the manufacture of pads useful in the methods of this invention, a solid or semi-solid insert is first placed in an enclosure, and the flowable material is then forced into the enclosure, thereby causing the insert to be bonded to or within the material after it has solidified. The insert can provide reinforcement to the pad so that the solidified material around the insert need not be self-supporting or otherwise of a consistency necessary to support the polishing layer. Alternatively or in addition, the insert can provide structural integrity to the pad, thereby providing improved performance, longevity and/or greater flexibility in manufacturing.

Machining a groove or indentation into a pad disrupts the pad's surface, causing fracturing, abrasion, irregularities or otherwise macro-defects to the pad surface; in the precision polishing required in the semiconductor industry, such macro-defects (due to machining a macro-texture into a polishing pad) can be detrimental to pad performance (particularly predictability). By flowing and solidifying (e.g., molding) at least a portion of the macro-texture into (or onto) the pad polishing layer (without cutting) in accordance with the present invention, the polishing layer surface is far less disturbed or damaged (relative to machining); therefore the pads of the present invention will exhibit fewer macro-defects, and pad polishing performance and predictability of pad performance, are generally improved.

Although molding technology useful in accordance with the present invention is quite common in many industries, the molding of the present invention involves an average mold aspect ratio of at least 400, more preferably at least 500 and yet more preferably greater than 700.

The "aspect ratio" is intended to mean a selected length divided by the average thickness of the pad.

Molding a precision polishing pad with such a high aspect ratio is contrary to prevailing views in the industry and can be difficult, if not impossible, depending upon the pad material selected. As a result, polishing pads have been manufactured by other manufacturing operations, such as by coagulating polymer onto felt substrates or by casting a polymeric material into cakes (which are then skived to produce a polishing pad), because the advantages of the present invention have not been appreciated by those of ordinary skill in the art.

Surprisingly, the preferred pad compositions of the present invention can be molded in accordance with the present invention to provide polishing pads which are able to satisfy needs which are not otherwise obtainable with common prior art pad manufacturing processes. For example, the pads of the present invention are generally more precise and reproducible, relative to many conventional pad manufacturing processes.

Pads are generally conditioned prior to use. The conditioning creates or augments the micro-texture of the pad. During use, the micro-texture can experience unwanted plastic flow and can be fouled by debris. As a result, pads are generally re-conditioned periodically during their useful life to regenerate an optimal micro-texture. In some embodiments, the polishing pads of the present invention require less re-conditioning during use, relative to conventional polishing pads.

In a preferred embodiment, the pad's macro-structure is incorporated into the surface of the polishing layer, due to the presence of mold protrusions around which pad material initially flows and solidifies. In this way, the macro-texture can be simultaneously created along the polishing layer's outer surface as the pad material solidifies. The macro-texture preferably comprises one or more indentations having an average depth and/or width of greater than 0.01, more preferably 0.05 and yet more preferably 0.1 millimeters. This macro-texture facilitates the flow of polishing fluid and thereby enhances polishing performance.

A preferred process of the present invention is directed to injection molding, particularly "reaction injection molding" or "RIM". RIM generally involves mixing reactive liquid (or semi-liquid) precursors which are then rapidly injected into the mold. Once the mold is filled, the reactive precursors proceed with a chemical reaction, causing solidification of a final molded product. This type of injection molding is most preferred, because the pad's physical properties can be fine tuned by adjusting the reactive chemistry. In addition, reaction injection molding generally uses lower viscosity precursors than thermoplastic injection molding, thereby allowing for easier filling of high aspect ratio molds.

Urethane prepolymers are a preferred reactive chemistry for reaction injection molding in accordance with the present invention. "Prepolymers" are intended to mean any precursor to the final polymerized product, including oligomers or monomers. Many such prepolymers are well known and commercially available. Urethane prepolymers generally comprise reactive moieties at the ends of the prepolymer chains.

A common reactive moiety for a urethane prepolymer is isocyanate. Commercially available isocyanate prepolymers include di-isocyanate prepolymers and tri-isocyanate prepolymers. Examples of di-isocyanate polymers include toluene diisocyanate and methylene diisocyanate. The isocyanate prepolymer preferably comprises an average isocyanate functionality of at least two. An average isocyanate functionality greater than 4 is generally not preferred, since processing can become difficult, depending upon the molding equipment and process being used.

The isocyanate prepolymer is generally reacted to a second prepolymer having an isocyanate reactive moiety. Preferably, the second prepolymer comprises, on average, at least two (2) isocyanate reactive moieties. Isocyanate reactive moieties include amines, particularly primary and secondary amines, and polyols; preferred prepolymers include diamines, diols and hydroxy functionalized amines. In addition, abrasive particles may be incorporated into the pad material. De-watered polishing fluid or any precursor to a polishing fluid may be incorporated into the pad, whereby during polishing, as water is placed within the polishing interface and the pad wears, the pad provides constituents to create or improve the polishing fluid.

Any prepolymer chemistry however could be used in accordance with the present invention, including polymer systems other than urethanes, provided the final product exhibits the following properties: a density of greater than $0.5 g/cm^3$, more preferably greater than $0.7 g/cm^3$ and yet more preferably greater than about $0.9 g/cm^3$; a critical surface tension greater than or equal to 34 milliNewtons per meter; a tensile modulus of 0.02 to 5 GigaPascals; a ratio of the tensile modulus at 30° C. to the modulus at 60° C. in the range of 1.0 to 2.5; hardness of 25 to 80 Shore D; a yield stress of 300 to 6000 psi; a tensile strength of 500 to 15,000 psi, and an elongation to break up to 500%. These properties are possible for a number of materials useful in injection molding and similar-type processes, such as: polycarbonate, polysulphone, nylon, ethylene copolymers, polyethers, polyesters, polyether-polyester copolymers, acrylic polymers, polymethyl methacrylate, polyvinyl chloride, polycarbonate, polyethylene copolymers, polyethylene imine, polyurethanes, polyether sulfone, polyether imide, polyketones, and the like, including photochemical reactive derivatives thereof.

A catalyst is often necessary to decrease the polymerization reaction time, particularly the gel time and the de-mold time. However, if the reaction is too fast, the material may solidify or gel prior to complete filling of the mold. Gel time is preferably in the range of a half second and one hour, more preferably in the range of about 1 second and about 5 minutes, more preferably 10 seconds to 5 minutes, and yet more preferably 30 seconds to 5 minutes.

Preferred catalysts are devoid of transition metals, particularly zinc, copper, nickel, cobalt, tungsten, chromium, manganese, iron, tin, or lead. The most preferred catalyst for use with a urethane prepolymer system comprises a tertiary amine, such as, diazo-bicyclo-octane. Other useful catalysts include, organic acids, primary amines and secondary amines, depending upon the particular reactive chemistry chosen.

In a preferred embodiment, the pad material is sufficiently hydrophilic to provide a critical surface tension greater than or equal to 34 milliNewtons per meter, more preferably greater than or equal to 37 and most preferably greater than or equal to 40 milliNewtons per meter. Critical surface tension defines the wettability of a solid surface by noting the lowest surface tension a liquid can have and still exhibit a contact angle greater than zero degrees on that solid. Thus, polymers with higher critical surface tensions are more readily wet and are therefore more hydrophilic. Critical Surface Tension of common polymers are provided below:

| Polymer | Critical Surface Tension (mN/m) |
| --- | --- |
| Polytetrafluoroethylene | 19 |
| Polydimethylsiloxane | 24 |
| Silicone Rubber | 24 |
| Polybutadiene | 31 |
| Polethylene | 31 |
| Polystyrene | 33 |
| Polypropylene | 34 |
| Polyester | 39–42 |
| Polyacrylamide | 33–40 |
| Polyvinyl alcohol | 37 |
| Polymethyl methacrylate | 39 |
| Polyvinyl chloride | 39 |
| Polysulfone | 41 |
| Nylon 6 | 42 |
| Polyurethane | 45 |
| Polycarbonate | 45 |

In one embodiment, the pad matrix is derived from at least:

1. an acrylated urethane;
2. an acrylated epoxy;
3. an ethylenically unsaturated organic compound having a carboxyl, benzyl, or amide functionality;
4. an aminoplast derivative having a pendant unsaturated carbonyl group;
5. an isocyanurate derivative having at least one pendant acrylate group;
6. a vinyl ether,
7. a urethane
8. a polyacrylamide
9. an ethylene/ester copolymer or an acid derivative thereof;
10. a polyvinyl alcohol;
11. a polymethyl methacrylate;
12. a polysulfone;
13. an polyamide;
14. a polycarbonate;
15. a polyvinyl chloride;
16. an epoxy;
17. a copolymer of the above; or
18. a combination thereof.

Preferred pad materials comprise urethane, carbonate, amide, sulfone, vinyl chloride, acrylatc, methacrylate, vinyl alcohol, ester or acrylamide moieties. The pad material can be porous or non-porous. In one embodiment, the matrix is non-porous; in another embodiment, the matrix is non-porous and free of fiber reinforcement.

In a preferred embodiment, the polishing layer material comprises: 1. a plurality of rigid domains which resists plastic flow during polishing; and 2. a plurality of less rigid domains which are less resistant to plastic flow during polishing. This combination of properties provides a dual mechanism which has been found to be particularly advantageous in the polishing of silicon dioxide and metal. The hard domains tend to cause the protrusion to rigorously engage the polishing interface, whereas the soft domains tend to enhance polishing interaction between the protrusion and the substrate surface being polished.

The rigid phase size in any dimension (height, width or length) is preferably less than 100 microns, more preferably less than 50 microns, yet more preferably less than 25 microns and most preferably less than 10 microns. Similarly the non-rigid phase is also preferably less than 100 microns, more preferably less than 50 microns, more preferably less than 25 microns and most preferably less than 10 microns. Preferred dual phase materials include polyurethane polymers having a soft segment (which provides the non-rigid phase) and a hard segment (which provides the rigid phase). The domains are produced during the forming of the polishing layer by a phase separation, due to incompatibility between the two (hard and soft) polymer segments.

Other polymers having hard and soft segments could also be appropriate, including ethylene copolymers, copolyester, block copolymers, polysulfones copolymers and acrylic copolymers. Hard and soft domains within the pad material can also be created: 1. by hard and soft segments along a polymer backbone; 2. by crystalline regions and non-crystalline regions within the pad material; 3. by alloying a hard polymer with a soft polymer; or 4. by combining a polymer with an organic or inorganic filler. Useful such compositions include copolymers, polymer blends interpenetrating polymer networks and the like.

The pads of the present invention are preferably side-filled by injecting the pad material into the mold at a point along the periphery of the mold. Pads may also be center filled by injecting flowable material into the mold at or near the geometric center of a mold face.

A preferred method of creating the macro-channels or macro-indentations is by molding, particularly injection molding, whereby the macro-texture is formed in situ by one or more thin-walled protrusions extending into the mold. The mold protrusions preferably provide an inverted image which is complementary to the intended macro-texture design or configuration. Injection molding is a well known technology and need not be described further here. The macro-indentation(s) is(are) useful in providing large flow channels for the polishing fluid, during the polishing operation.

An agent comprising a wax, hydrocarbon or other solid, semi-solid or liquid organic material can be applied to the mold to enhance release of the molded part after molding. A preferred mold release agent comprises a solid organic material and a solvent or liquid carrier. A particularly preferred mold release agent is a fluorocarbon dispersion, available from E. I. du Pont de Nemours and Company, Wilmington, Del., USA. Preferred solvents or liquid carrier materials have a vapor pressure in the range of 0.1 to 14.7 pounds per square inch ("psi"), more preferably 1–12 psi and yet more preferably in the range of 4.5 to 5.5 psi. In a preferred embodiment, a wax, hydrocarbon or other non-polar solid organic material is dissolved or suspended in an organic solvent, preferably a non-polar organic solvent, such as mineral spirits, and applied as a mold release agent prior to the injection operation. Alternatively, an internal mold release agent can be used, which is incorporated directly into the pad material and aids in de-molding the pad after pad manufacture.

Pad surface topography is relatively consistent for pads of the present invention, because the mold surface remains generally the same for each pad produced by it. Pads produced by many conventional methods are generally more prone to variations and inconsistencies. Predictability of performance is an important aspect of a precision polishing pad. Pad consistency allows for more exacting standard operating procedures and therefore more productive (and reproducible) polishing operations.

After forming the pad's polishing layer, including at least a part of the macro-texture, the outer surface can be further modified by adding a micro-texture. The micro-texture is preferably created by moving the polishing layer surface against the surface of an abrasive material. In one embodiment, the abrasive material is a rotating structure (the abrasive material can be round, square, rectangular, oblong or of any geometric configuration) having a plurality of rigid particles embedded (and preferably, permanently affixed) upon the surface. The movement of the rigid particles against the pad surface causes the pad surface to undergo plastic flow, fragmentation or a combination thereof (at the point of contact with the particles). The abrasive surface need not rotate against the pad surface; the abrasive surface can move against the pad in any one of a number of ways, including vibration, linear movement, random orbitals, rolling or the like.

The resulting plastic flow, fragmentation or combination thereof (due to the abrasive surface), creates a micro-texture upon the pad's outer surface. The micro-texture can comprise a micro-indentation with a micro-protrusion adjacent to at least one side. In one embodiment, the micro-protrusions provide at least 0.1 percent of the surface area of the pad's polishing surface, and the micro-indentations have an average depth of less than 50 microns, more preferably less than 10 microns, and the micro-protrusions have an average height of less than 50 microns and more preferably less than 10 microns. Preferably, such surface modification with an abrasive surface will cause minimal abrasion removal of the polishing layer, but rather merely plows furrows into the pad without causing a substantial amount, if any, of pad material to separate from the polishing layer. However, although less preferred, abrasion removal of pad material is acceptable, so long as a micro-texture is produced.

In an alternative embodiment, at least a portion of the micro-indentations or micro-protrusions may also be created during the molding process by incorporation of appropriate features into the mold. Formation of micro-texture and macro-texture during the fabrication of the pad can diminish or even negate the necessity of preconditioning break-in. Such formation also provides more controlled and faithful replication of the micro-texture as compared to surface modification subsequent to pad creation.

The pads of the present invention are preferably used in combination with a polishing fluid, such as a polishing slurry, for such processes as chemical mechanical polishing of a metal, silicon or silicon dioxide substrate. During polishing, the polishing fluid is placed between the pad's polishing surface and the substrate to be polished. As the pad is moved relative to the substrate being polished, the micro-indentations allow for improved polishing fluid flow along the interface (between the pad and the substrate to be polished). The improved flow of polishing fluid generally allows for more efficient and effective polishing performance. Also, during polishing, the substrate and the polishing layer are pressed against each other, most usually using a pressure between the substrate and the polishing layer of greater than 0.1 kilograms per square meter.

The pads of the present invention have been found to be particularly useful when used in conjunction with polishing fluids in which abrasive particles have been dispersed with a dispersing agent from a class of compounds known as amino alcohols. Amino alcohols are defined as organic compounds which contain at least one amino group and one hydroxyl group. To provide stability amino alcohols may be used at 0.01% to 10% by weight in the aqueous dispersions of submicron abrasive particles according to this invention. Submicron abrasive particles which might be stabilized with the amino alcohols include, but are not limited to, silica, ceria, alumina, titania, and silica gel. The submicron abrasive particles should have a primary particle size in the range of 5 nanometers to 100 nanometers. Primary particle size can be determined by TEM imaging where the smallest particles are measured even if shown as part of an agglomeration.

It has also been shown that pads of this invention are particularly useful when used in conjunction with a polishing fluid which contains a small amount of an organic polymer having a degree of polymerization of at least five with a plurality of moieties having affinity to surface groups contained on insulating layer surfaces. These groups are commonly polar moieties, such as, but not limited to, hydroxy, carboxy, carbonyl, alkoxy, sulphonyl, and phosphonyl. Examples of this type of molecule include poly-vinyl alcohol, poly-vinylpyrrolidone, poly-methyl methacrylate, poly-formaldehyde, poly-ethylene oxide, poly-ethylene glycol, and poly-methacrylic acid. This additive is disclosed in Pat. application Ser. No. 09/329,225 which is made a part of this specification by reference. In the previous application, the additive was made a part of the CMP slurry to provide silica rate suppression. The polymer additive in the present invention provides a polished surface with less surface roughness and fewer scratches.

Since at least some of the macro-texture is not created by an external means (such as by machining), the macro-texture is less prone to macro-defects, such as burrs or protrusions. This has been found to improve polishing pad performance by providing a polishing surface having very low levels of macro-defects and by substantially diminishing debris trapped in the macro-indentations that would otherwise inhibit the flow of polishing fluid.

In use, the pads of the present invention are preferably attached to a platen and then brought sufficiently proximate with a workpiece to be polished or planarized. Surface irregularities are removed at a rate which is dependent upon a number of parameters, including: pad pressure on the workpiece surface (or vice versa); the speed at which the pad and workpiece move in relation to one another; and the components of the polishing fluid.

As the pad polishes, the micro-texture can experience abrasion removal or plastic flow (the micro-protrusions are flattened or are otherwise less pronounced), which can diminish polishing performance. The micro-protrusions are then preferably re-formed with further conditioning, such as by moving the pad against an abrasive surface again and causing the material to once again form furrows. Such reconditioning is generally not as rigorous and/or not required as often for pads of the present invention, relative to may common prior art pads.

The preferred abrasive surface for conditioning is a disk which is preferably metal and which is preferably embedded with diamonds of a size in the range of 1 micron to 0.5 millimeters. During conditioning, the pressure between the conditioning disk and the polishing pad is preferably between 0.1 to about 25 pounds per square inch. The disk's speed of rotation is preferably in the range of 1 to 1000 revolutions per minute.

A preferred conditioning disk is a four inch diameter, 100 grit diamond disk, such as the RESI™ Disk manufactured by R. E. Science, Inc. Optimum conditioning was attained when the downforce was 10 lbs per square inch, platen speed was 75 rpm, the sweep profile was bell-shaped, the number of preconditioning break-in sweeps was 15 and the number of replenishing conditioning sweeps between wafers was 15.

Optionally, conditioning can be conducted in the presence of a conditioning fluid, preferably a water based fluid containing abrasive particles.

The polishing fluid is preferably water based and may or may not require the presence of abrasive particles, depending upon the composition of the polishing layer. For example, a polishing layer comprising abrasive particles may not require abrasive particles in the polishing fluid.

EXAMPLES

Examples 1 and 2 are comparative examples. Example 3 illustrates pads useful in the present invention. Example 4 shows the results of polishing an insulation layer with pads and slurries of this invention.

(Comparative) Example 1

A polymeric matrix was prepared by mixing 2997 grams of polyether-based liquid urethane with 768 grams of 4, 4-methylene-bis-chloroaniline at about 1 50° F. At this temperature, the urethane/polyfunctional amine mixture has a pot life of about 2.5 minutes; during this time, about 69 grams of hollow elastic polymeric microspheres were blended at 3450 rpm using a high shear mixer to evenly distribute the microspheres in the mixture. The final mixture was transferred to a conventional mold and permitted to gel for about 15 minutes.

The mold was then placed in a curing oven and cured for about 5 hours at about 200° F. The mixture was then cooled for about 4–6 hours, until the mold temperature was about 70° F. The molded article was then "skived" into thin sheets and macro-channels mechanically machined into the surface. The machining process produced jagged, irregular grooves with surface burrs.

A four inch diameter, 100 grit diamond disk was used to produce micro-channels and micro-protrusions on the surface of the pad. The disk was a RESI™ Disk manufactured by R. E. Science, Inc. Conditioning was accomplished with a downward force of about 10 lbs., a platen speed of 75 rpm, a bell-shaped sweep profile, and about 15 sweeps.

(Comparative) Example 2

This example used the same manufacturing process as Example 1 but the polyurethane was unfilled. By eliminating the filler, the pad properties are generally more reproducible; however, since the pads are now harder, machining problems are found to be greater.

Example 3

Instead of separate skiving and machining steps, polyurethane formulations similar to those used in Examples 1 and 2 were formed into a pad by injection molding into a mold having the complementary final dimensions and groove design of the desired pad. This is a net-shape process, eliminating the need for separate skiving and grooving operations.

The resultant pads of this example (Example 3) had less part-to-part variability in thickness and groove dimensions, and the grooves were substantially free of macro-defects (e.g., burrs). During oxide CMP polishing, fewer defects upon the substrate were induced. The pad's useful life was increased, because there was less need for pad conditioning between wafers.

| Pad Type/Parameter | Pad Lifetime | Defectivity | Modulus Ratio E(30° C.):E(60° C.) |
|---|---|---|---|
| Example 1: | 300 wafers | baseline | 2.0–2.5 |
| Example 2: | 400 wafers | 5 × baseline | 2.0–2.5 |
| Example 3: Present Invention | 1200 wafers | 0.1 × baseline | 1.3–2.0 |

Example 4

Polishing tests on TEOS wafers shown below in Table 2 were carried out on a Strasbaugh 6DS-SP polisher under the following conditions: Time, 120 sec; Down force, 7 psi; Back pressure, 0.5 psi; Platen speed, 51 rpm; Carrier speed, 41 rpm; Temperature, ambient; Slurry flow, 125 ml/min; Slurry dilution ratio, 1:1 with DI water; Pad type, a pad according to Example 3 in which the polyurethane is unfilled.

TABLE 2

| Slurry | Composition Weight % | SiO$_2$ RR Å/min | Roughness RMS nm | P-V nm |
|---|---|---|---|---|
| G | 25% A-70, 1.7% TA, 0.38% KOH | 1800 | .30 | 3.9 |
| H | G + 0.2% PVP | 1800 | .26 | 3.9 |
| L | 20% A-130, 1% TA, 0.36% KOH | 1600 | .42 | 5.2 |
| M | L + 0.2% PVP | 1900 | .28 | 5.0 |

A-70 = fumed silica powder with a surface area of 70–100 m$^2$/g
TA = Tris(hydroxymethyl)aminomethane
PVP = poly-vinylpyrrolidone.
A-130 = fumed silica powder with a surface area of 120–140 m$^2$/g The above table shows the improvement in surface roughness of an insulating layer on the surface of a semiconductor wafer which occurs upon addition of an organic polymer (PVP) to a CMP slurry used in conjunction with a pad of this invention when polishing the surface of the semiconductor wafer. The surface measurements were obtained using an Atomic Force Microscope (AFM) available from Digital Instruments, Inc. Using the tapping mode, a silicon tip, and a measurement area of 10 microns by 10 microns, the root mean square (RMS) roughness and the peak to valley (P-V) roughness were determined. Surface condition can be observed from the images provided by the AFM. FIGS. 1 to 4 show AFM images of the wafer surfaces after polishing with slurries G, H, L, and M. These images dramatically show the improvement in surface condition when using an organic polymer in the slurries. Such a polymer would typically be used in concentrations of 0.01% to 5% in the slurries of this invention.

Nothing from the above discussion is intended to be a limitation of any kind with respect to the present invention. All limitations to the present invention are intended to be found only in the claims, as provided below.

What is claimed is:

1. A method of polishing a semiconductor wafer, comprising:

a) providing a polishing pad having a polishing layer, said polishing layer consisting essentially of a hydrophilic polishing layer having no intrinsic ability to absorb a plurality of slurry particles, said polishing layer having a polishing surface consisting essentially of a polishing material having:

i. a density greater than 0.5 g/cm$^3$;
   ii. a critical surface tension greater than or equal to 34 milliNewtons per meter;
   iii. a tensile modulus of 0.02 to 5 GigaPascals;
   iv. a ratio of tensile modulus at 30° C. to tensile modulus at 60° C. of 1.0 to 2.5;
   v. a hardness of 25 to 80 Shore D;
   vi. a yield stress of 300–6000 psi;
   vii. a tensile strength of 1000 to 15,000 psi; and
   viii. an elongation to break less than or equal to 500%, said polishing material comprising at least one moiety from the group consisting of: a urethane produced by a catalyst which accelerates an isocyanate reaction, said catalyst being devoid of copper, tungsten, iron or chromium; a carbonate; an amide; an ester; an ether; an acrylate; a methacrylate; an acrylic acid; a methacrylic acid; a sulphone; an acrylamide; a halide; and a hydroxide, said polishing surface having a random surface topography and having a macro-texture produced by solidifying a flowable material, and b) chemical mechanical polishing said semiconductor wafer with said pad and with a polishing composition comprising: water, an aqueous dispersion of submicron abrasive particles for which an amino alcohol is used as a stabilizing component, and a chemically interactive component that interacts with the surface being polished.

2. A method in accordance with claim 1, wherein said macro-texture is incorporated into the polishing surface due to: i. compression by positive or negative pressure; ii. molding; iii. printing; iv. casting; v. sintering; vi. photo-imaging; or vii. chemical etching.

3. A method in accordance with claim 2, wherein the polishing pad is formed by reaction injection molding.

4. A method in accordance with claim 1, wherein the polishing surface is conditioned to create a plurality of micro-asperities by moving an abrasive medium against the polishing surface, said abrasive medium carrying a plurality of rigid particles.

5. A method in accordance with claim 1, wherein the polishing pad has a Shore D hardness of between 50 and 80.

6. A method in accordance with claim 1, wherein said amino alcohol is tris(hydroxymethyl)aminomethane.

7. A method of polishing a semiconductor wafer, comprising:
   a) providing a polishing pad having a polishing layer, said polishing layer consisting essentially of a hydrophilic polishing layer having no intrinsic ability to absorb a plurality of slurry particles, said polishing layer having a polishing surface consisting essentially of a polishing material having:
   i. a density greater than 0.5 g/cm$^3$;
   ii. a critical surface tension greater than or equal to 34 milliNewtons per meter;
   iii. a tensile modulus of 0.02 to 5 GigaPascals;
   iv. a ratio of tensile modulus at 30° C. to tensile modulus at 60° C. of 1.0 to 2.5;
   v. a hardness of 25 to 80 Shore D;
   vi. a yield stress of 300–6000 psi;
   vii. a tensile strength of 1000 to 15,000 psi; and
   viii. an elongation to break less than or equal to 500%, said polishing material comprising at least one moiety from the group consisting of: a urethane produced by a catalyst which accelerates an isocyanate reaction, said catalyst being devoid of copper, tungsten, iron or chromium; a carbonate; an amide; an ester; an ether; an acrylate; a methacrylate; an acrylic acid; a methacrylic acid; a sulphone; an acrylamide; a halide; and a hydroxide,
   said polishing surface having a random surface topography and having a macro-texture produced by solidifying a flowable material, and
   b) chemical mechanical polishing said semiconductor wafer with said pad and with a polishing composition comprising an organic polymer having a degree of polymerization of at least five, said polymer having a plurality of moieties with affinity to surface groups on said semiconductor wafer.

8. A method in accordance with claim 7, wherein said macro-texture is incorporated into the polishing surface due to: i. compression by positive or negative pressure; ii. molding; iii. printing; iv. casting; v. sintering; vi. photo-imaging; or vii. chemical etching.

9. A method in accordance with claim 7, wherein the polishing surface is conditioned to create a plurality of micro-asperities by moving an abrasive medium against the polishing surface, said abrasive medium carrying a plurality of rigid particles.

10. A method in accordance with claim 8, wherein the polishing pad is formed by reaction injection molding.

11. A method in accordance with claim 7 wherein said organic polymer is from the group of poly-vinyl alcohol, poly-vinylpyrrolidone, poly-methyl methacrylate, poly-formaldehyde, poly-ethylene oxide, poly-ethylene glycol, and poly-methacrylic acid.

12. A method in accordance with claim 11 wherein said organic polymer is poly-vinylpyrrolidone.

* * * * *